(12) United States Patent
Tsai et al.

(10) Patent No.: US 7,916,551 B2
(45) Date of Patent: Mar. 29, 2011

(54) METHOD OF PROGRAMMING CELL IN MEMORY AND MEMORY APPARATUS UTILIZING THE METHOD

(75) Inventors: Wen-Jer Tsai, Hsinchu (TW); Ta-Hui Wang, Hsinchu (TW); Chih-Wei Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 143 days.

(21) Appl. No.: 12/138,707

(22) Filed: Jun. 13, 2008

(65) Prior Publication Data

US 2009/0116294 A1    May 7, 2009

Related U.S. Application Data

(60) Provisional application No. 60/985,966, filed on Nov. 6, 2007.

(51) Int. Cl.
 *G11C 11/34* (2006.01)
(52) U.S. Cl. ............... 365/185.28; 365/203; 365/185.18
(58) Field of Classification Search ............. 365/185.23, 365/185.01, 185.05, 185.17, 185.25, 185.26, 365/207, 189.07, 185.29
See application file for complete search history.

(56) References Cited

U.S. PATENT DOCUMENTS

| | | | |
|---|---|---|---|
| 4,803,662 A | 2/1989 | Tanaka | |
| 6,147,912 A * | 11/2000 | Kitazawa | ................. 365/189.02 |
| 6,690,601 B2 | 2/2004 | Yeh et al. | |
| 6,822,900 B2 | 11/2004 | Kamei | |
| 7,020,020 B1 | 3/2006 | Lojek | |
| 2003/0053337 A1* | 3/2003 | Murata | .................... 365/185.18 |
| 2007/0047309 A1 | 3/2007 | Satoh et al. | |
| 2007/0063259 A1* | 3/2007 | Derderian et al. | ............. 257/315 |
| 2007/0133302 A1* | 6/2007 | Oda | ......................... 365/185.23 |

FOREIGN PATENT DOCUMENTS

TW            200713289        4/2007

* cited by examiner

*Primary Examiner* — Dang T Nguyen
(74) *Attorney, Agent, or Firm* — J.C. Patents

(57) ABSTRACT

A method of programming a first cell in a memory, wherein the first cell has a first S/D region and shares a second S/D region with a second cell that has a third S/D region opposite to the second S/D region. The channels of the first and the second cells are turned on, a first voltage is applied to the first S/D region, a second voltage is applied to the second S/D region and a third voltage is applied to the third S/D region. The second voltage is between the first voltage and the third voltage, and the first to third voltages make carriers flow from the third S/D region to the first S/D region and cause hot carriers in the channel of the first cell to be injected into the charge storage layer of the first cell.

34 Claims, 5 Drawing Sheets

US 7,916,551 B2

METHOD OF PROGRAMMING CELL IN MEMORY AND MEMORY APPARATUS UTILIZING THE METHOD

CROSS-REFERENCE TO RELATED APPLICATION

This application claims the priority benefit of U.S.A. provisional application Ser. No. 60/985,966, filed on Nov. 6, 2007. The entirety of the above-mentioned patent application is hereby incorporated by reference herein and made a part of this specification.

BACKGROUND OF THE INVENTION

1. Field of Invention

This invention relates to operation of memory devices, and more particularly to a method of programming a cell in a memory (array) that shares an S/D region with another cell, and to a memory apparatus utilizing the method.

2. Description of Related Art

Non-volatile memory devices have been widely used in the fields of long-term storage as being able to retain data without a power and having smaller sizes. For the convenience of use, most of current non-volatile memory devices are programmed and erased electrically. FIGS. 1-3 respectively illustrate three types of non-volatile memory cell and their respective programming methods in the prior art.

Referring to FIG. 1, the memory cell includes a substrate 100, a control gate 110, a floating gate 120, a select gate 130 and S/D regions 140, 150 and 160. To program the cell, the channels under the gates 130 and 120 are turned on by gate voltages $Vg_s$ and $Vg_c$, and a source voltage Vs and a higher drain voltage Vd are applied to the S/D regions 140 and 150 respectively to induce an electron current from 140 to 150 through 160 and cause hot electrons under the floating gate 120 to be injected. Such a cell needs a large area so that the integration degree of the memory cells is reduced.

Referring to FIG. 2, the cell includes a substrate 200, a control gate 210, a charge trapping layer 220, and two S/D regions 240 and 250. To program the cell, the channel under the trapping layer 220 is turned on by Vg, and Vs and Vd applied to the regions 240 and 250 respectively to induce an electron current from 240 to 250 and cause hot electrons under the trapping layer 220 to be injected. The cell needs a smaller area, but the unselected cells coupled to the bit lines coupled to the programmed cell easily suffer from a punch-through issue. Though a certain raise in Vs prevents punch-through of unselected cells in the programming, the programming efficiency is reduced thereby.

Referring to FIG. 3, in the non-volatile memory, a cell 302 has a storage layer 320a and an S/D region 350 in the substrate 300 and shares an S/D region 360 with a neighboring cell 304 that has a storage layer 320b and an S/D region 340. The control gates 310 of the cells 302 and 304 are contiguous. The channels under the storage layers 320a and 320b are turned on by Vg, and Vs and Vd are applied to the regions 340 and 350 respectively to induce an electron current from 340 to 350 through 360 and cause hot electrons under the storage layer 320a to be injected. Each cell needs a small area and punch-through of unselected cells is avoided due to the reduced electric field in this case, but the programming efficiency is reduced due to more electron scattering.

SUMMARY OF THE INVENTION

In view of the foregoing, this invention provides a method of programming a memory cell that shares an S/D region with another cell.

This invention also provides a method of programming a cell in a memory array, which is based on the above programming method of this invention.

This invention further provides a memory apparatus, which includes a memory array to which a programming method of this invention is applicable, and a circuit unit that performs the steps in the programming method of this invention.

The method of programming a memory cell of this invention is described below. A first cell to be programmed has a first S/D region and shares a second S/D region with a second cell that has a third S/D region opposite to the second one. The channels of the two cells are turned on, a first voltage is applied to the first S/D region, a second voltage to the second S/D region and a third voltage to the third S/D region. The second voltage is between the first and the third voltages, and the first to third voltages make carriers flow from the third S/D region to the first one and cause hot carriers in the channel of the first cell to be injected into the charge storage layer of the first cell.

In an embodiment, the control gate of the first cell is contiguous with that of the second cell. In another embodiment, the control gate of the first cell is separated from that of the second cell.

In some embodiments, the first cell and the second cell are of N-type and the first voltage is positively higher than the third voltage. In such a case, the second voltage is preferably higher than a voltage at which the electron current from the third S/D region to the second S/D region is larger than that from the second S/D region to the first S/D region, so as to improve the hot electron injection efficiency. In addition, turning on the channels of the first cell and the second cell may include applying 0V or a negative voltage to the substrate of the memory.

The above charge storage layer may be a floating gate or a charge trapping layer. The charge trapping layer may include silicon nitride.

The method to program a cell in a memory array of this invention includes the following steps. The channels of a first cell to be programmed and a neighboring second cell are turned on, wherein the first cell has a first S/D region and shares a second S/D region with the second cell that has a third S/D region. A first voltage is applied, via a first select transistor, to a first line coupled to the first S/D region. A second voltage is applied, via a second select transistor, to a second line coupled to the second S/D region. A third voltage is applied, via a third select transistor, to a third bit line coupled to the third S/D region. The second voltage is between the first voltage and the third voltage, and the first to third voltages make carriers flow from the third S/D region to the first S/D region and cause hot carriers in the channel of the first cell to be injected in the charge storage layer of the first cell. The above steps are not limited to be performed in the above order and may be performed substantially simultaneously.

In some embodiments of the above method, each cell is of N-type and the first voltage is positively higher than the third voltage. In such a case, the second voltage is preferably higher than a voltage at which the electron current from the third S/D region to the second S/D region is larger than that from the second S/D region to the first S/D region, so as to improve the hot carrier injection efficiency. In addition, turning on the channels of the first cell and the second cell may include applying 0V or a negative voltage to the substrate of the memory.

The above charge storage layer may be a floating gate or a charge trapping layer, wherein the charge trapping layer may include silicon nitride.

In an embodiment wherein the charge storage layer is a charge trapping layer, the above steps write a first bit of the first cell near the first S/D region. It is possible that the first cell shares the first S/D region with a third cell that has a fourth S/D region and the method further includes a process of writing a second bit of the first cell near the second S/D region. In the process, the channels of the first and the third cells are turned on. The first voltage is applied to the second line via the second select transistor. The second voltage is applied to the first line via the first select transistor. The third voltage is applied, via a fourth select transistor, to a fourth line coupled to the fourth S/D region. It is noted that the above steps are not limited to be performed in the above order and may be performed substantially simultaneously.

In an embodiment, the control gates of the first and the second cells are coupled to one word line, wherein the control gates of the first and second cells may be portions of the one word line. In such a case, the memory array may include rows and columns of cells wherein each cell includes a control gate and two neighboring cells in the same row shares an S/D region, a plurality of word lines each coupled to the control gates of one row of cells, and a plurality of bit lines as the lines coupled to S/D regions wherein each bit line is coupled to one column of S/D regions.

In another embodiment, the control gates of the first and second cells are coupled to two word lines respectively. It is possible that the control gate of each of the first and second cells is a portion of the corresponding word line. In such a case, the non-volatile memory array may include rows and columns of cells where each cell includes a control gate and two neighboring cells in a row shares an S/D region, a plurality of word lines each coupled to the control gates of one column of cells, and a plurality of source lines and a plurality of bit lines as the lines coupled to the S/D regions. Each source line is coupled to one column of S/D regions. In each row of cells, the S/D regions are alternately coupled to a source line and one of two bit lines, and the S/D regions not coupled to the source lines are coupled to the two bit lines alternately. In addition, the first S/D region, the second S/D region and the third S/D region mentioned above are coupled to a bit line, a source line and another bit line respectively, or to a source line a bit line and another source line respectively.

The memory apparatus of this invention includes a memory array and a circuit unit. The memory array includes rows and columns of cells, wherein each cell has a first S/D region and shares a second S/D region with a neighboring cell. The circuit unit applies at least the following steps in programming. The channel of a first cell to be programmed and that of a second cell neighboring to the first cell are turned on, wherein the first cell has the first S/D region and shares the second S/D region with the second cell and the second cell has a third S/D region. A first voltage is applied, via a first select transistor, to a first line coupled to the first S/D region. A second voltage is applied, via a second select transistor, to a second line coupled to the second S/D region. A third voltage is applied, via a third select transistor, to a third line coupled to the third S/D region. The second voltage is between the first voltage and the third voltage, and the first to third voltages make carriers flow from the third S/D region to the first S/D region and cause hot carriers in the channel of the first cell to be injected into a charge storage layer of the first cell. It is noted that the above steps are not limited to be performed in the above order and may be performed substantially simultaneously.

In an embodiment where the charge storage layer is a charge trapping layer, the first cell shares the first S/D region with a third cell that has a fourth S/D region, and the circuit unit further applies the following steps in the programming. The channels of the first cell and the third cell are turned on. The first voltage is applied to the second line via the second select transistor. The second voltage is applied to the first line via the first select transistor. The third voltage is applied, via a fourth select transistor, to a fourth line coupled to the fourth S/D region. The above steps are not limited to be performed in the above order and may be performed substantially simultaneously.

Since the voltage difference for programming is applied between an S/D region of a selected cell and the S/D region of a neighboring cell not shared with the selected cell, punch-through of unselected cells is inhibited. Moreover, as the voltage applied to the shared second S/D region is higher, by a suitable range, than a voltage at which the electron current from the third S/D region to the second one is larger than that from the second S/D region to the first one, the carriers in the channels of the two cells can be accelerated more efficiently to improve the hot carrier injection efficiency.

In order to make the aforementioned and other objects, features and advantages of the present invention comprehensible, a preferred embodiment accompanied with figures is described in detail below.

DESCRIPTION OF EMBODIMENTS

In the first embodiment, the control gate of a cell is contiguous with that of a neighboring cell sharing an S/D region with the cell. This may be seen in a case where the control gates of the two cells are coupled to one word line and are portions thereof. In the second embodiment, the control gates of the two cells are separated from each other. This may be seen in a case where the control gates of the two cells are coupled to two word lines respectively and each gate is a portion of the corresponding word line.

Figure 4:
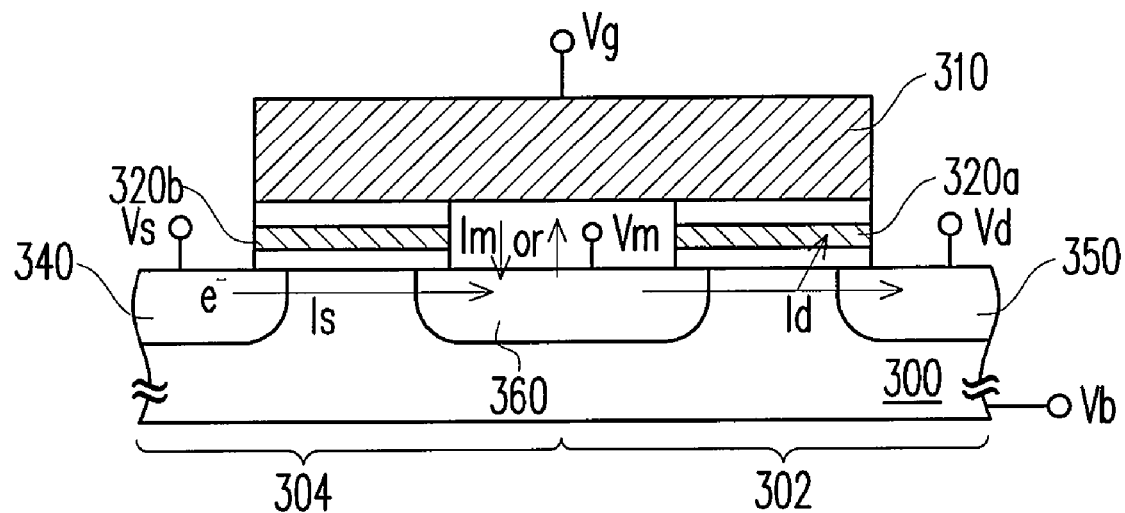
FIG. 4 illustrates a method of programming a cell in a non-volatile memory according to a first embodiment of this invention.

FIG. 4 illustrates a method of programming a cell in a non-volatile memory according to the first embodiment of this invention.

Referring to FIG. 4, in the non-volatile memory, a cell 302 has a charge storage layer 320a and an N-type S/D region 350 in the substrate 300 and shares an N-type S/D region 360 with a neighboring cell 304, which has a charge storage layer 320b and an N-type S/D region 340 opposite to the S/D region 360. The control gates 310 of the cells 302 and 304 are contiguous and may be two portions of a word line. The storage layers 320a and 320b may be floating gates or charge trapping layers. As the storage layers 320a and 320b are floating gates, they can be separated from the control gates 310 by an ONO composite layer. When the charge storage layers 320a and 320b are charge trapping layers, they may include silicon nitride (SiN).

In this embodiment, the programming of the cell 302 is exemplified. A voltage Vb (0V or a negative voltage like −1V) is applied to the substrate 300, a positive gate voltage Vg is applied to the control gates 310 to turn on the channels under the storage layers 320a and 320b, a source voltage Vs and a drain voltage Vd positively higher than Vs are respectively applied to the S/D regions 340 and 350, and a middle voltage Vm between Vs and Vd is applied to the middle S/D region 360. The voltages Vs, Vd and Vm make electrons flow from the region 340 to the region 350 and cause hot electrons in the channel of the cell 302 to be injected into the charge storage layer 320a. Vm is preferably within a suitable range around the mean of Vs and Vd, so that electrons are effectively "warmed up" in the channel of the neighboring cell 304 to have a higher kinetic energy in the channel of the selected cell 302 and generate more hot electrons improving the programming efficiency of the cell 302. In an example, Vb=0V, Vg=10V, Vs=0V, Vd=3-5V and Vm=1.6-2.5V.

Figure 5:
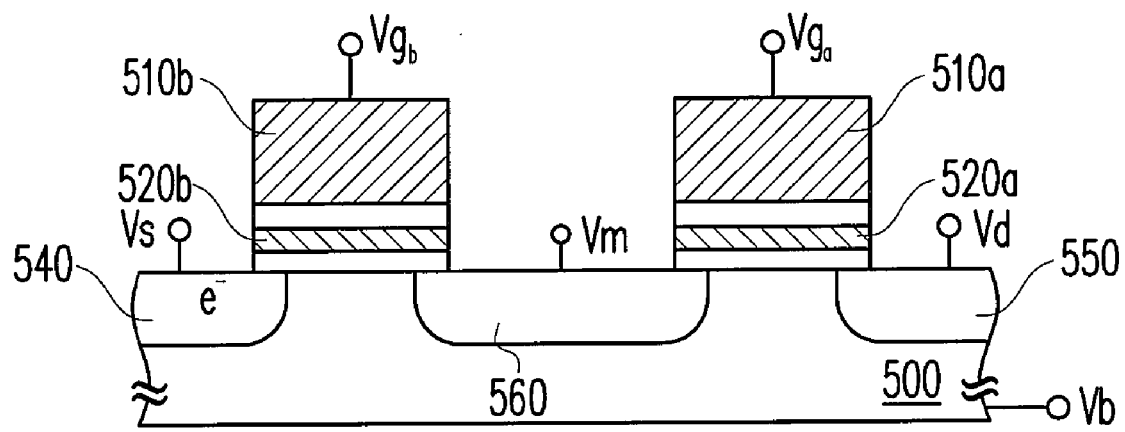
FIG. 5 illustrates a method of programming a cell in a non-volatile memory according to a second embodiment of this invention.

FIG. 5 illustrates a method of programming a cell in a non-volatile memory according to the second embodiment of this invention.

Referring to FIG. 5, in the non-volatile memory, a first cell has a charge storage layer 520a and an N-type S/D region 550 in the substrate 500 and shares an N-type S/D region 560 with a neighboring second cell that has a storage layer 520b and an N-type S/D region 540 opposite to the S/D region 560. The two control gates 510a and 510b of the first and the second cell are separated from each other, wherein each of the two control gates 510a and 510b may be a portion of a word line. The storage layers 520a and 520b may be floating gates or charge trapping layers as in the first embodiment.

In this embodiment, the programming of the first cell is taken as an example. The programming process is similar to that described in the first embodiment except that two positive gate voltages $Vg_a$ and $Vg_b$ are respectively applied to the control gates 510a and 510b to turn on the channels under them. The gate voltage $Vg_b$ applied to the gate 510b of the neighboring cell may be equal to or higher than the gate voltage $Vg_a$ applied to the gate 510a of the selected cell. In an example, $Vg_a$=10V and $Vg_b$=12V.

Figure 6:
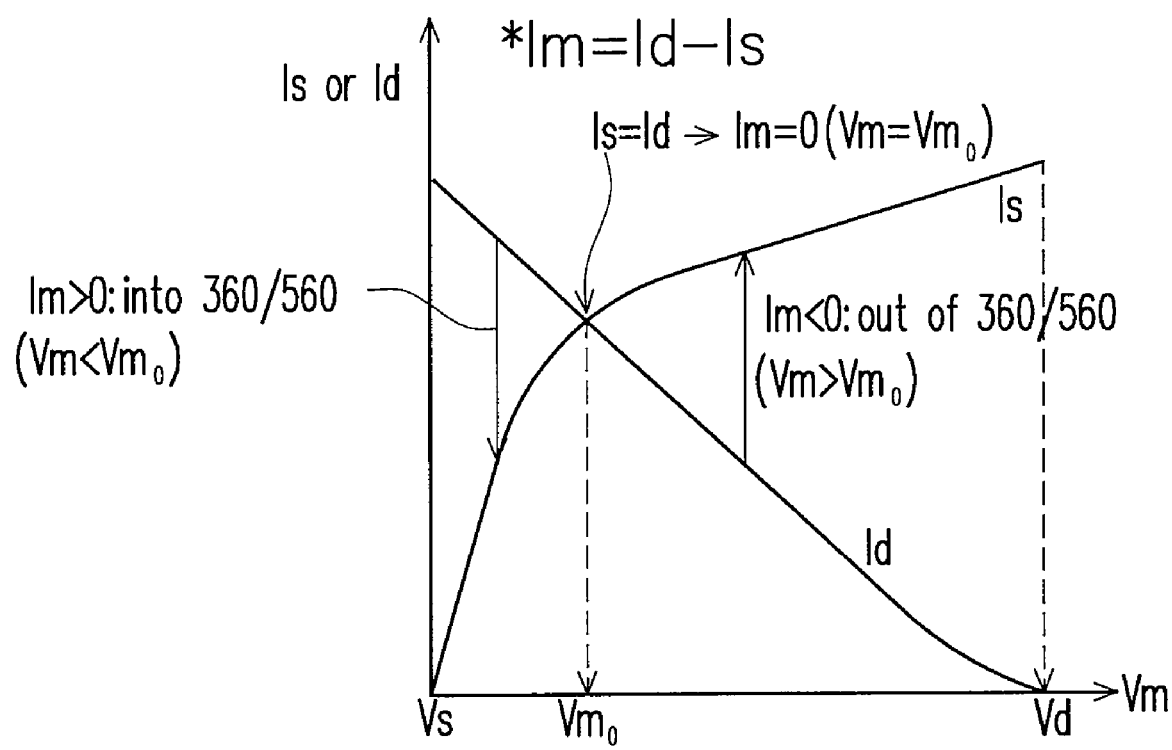
FIG. 6 illustrates respective variations of the electron current Is, Id and Im with the middle voltage Vm in the first and the second embodiments.

FIG. 6 illustrates respective variations of the electron current Is, Id and Im with the voltage Vm in the first and the second embodiments. When Vm is equal to Vs, Is is zero due to the zero voltage difference between the S/D regions 340 and 360 (or 540 and 560), and there is no punch-through inhibition effect for unselected cells. When Vm is equal to Vd, Id is zero due to the zero voltage difference between the S/D regions 360 and 350 (or 560 and 550), and hot electrons are injected in the storage layer 320b or 520b of the neighboring cell but not in that of the selected cell. Since the electrical behaviors in the two cases of FIGS. 4-5 are similar, only the case of FIG. 4 is discussed.

Figure 1:
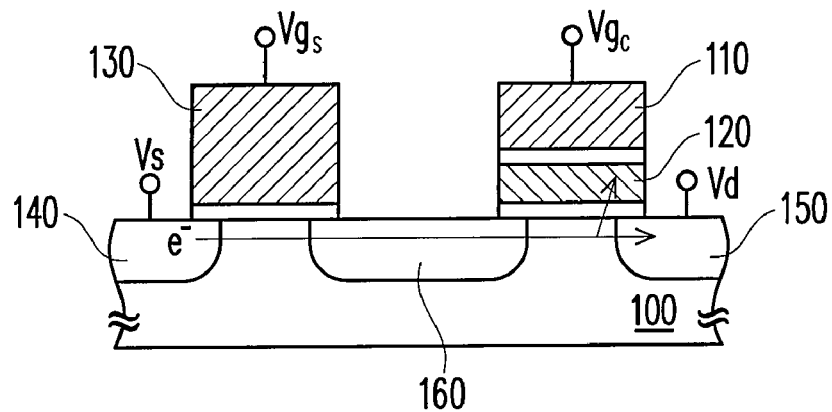
FIGS. 1-3 respectively illustrate three types of non-volatile memory cell and their respective programming methods in the prior art.
Figure 2:
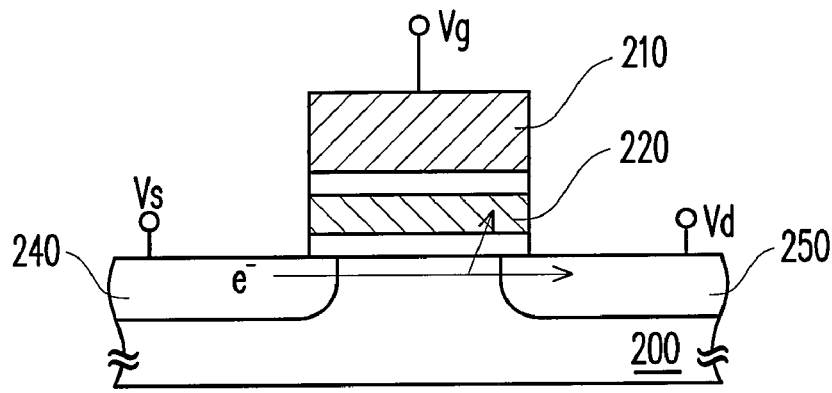

When Vm is lower than a voltage $Vm_0$ at which Is is equal to Id, the residual energy E1 of electrons at the region 360 satisfies "E1≦e.(Vm−Vs)", most electrons from the region 360 to the region 350 have a energy lower than e.(Vd−Vm), and the residual energy E2 of electrons at the region 350 satisfies "E2≦e.(Vd−Vm)". In such a case, the program speed is comparable to the conventional method in FIG. 2, the punch-through suppression may be insufficient, and the warm-up effect is insignificant so that the injection efficiency is not boosted.

Figure 3:
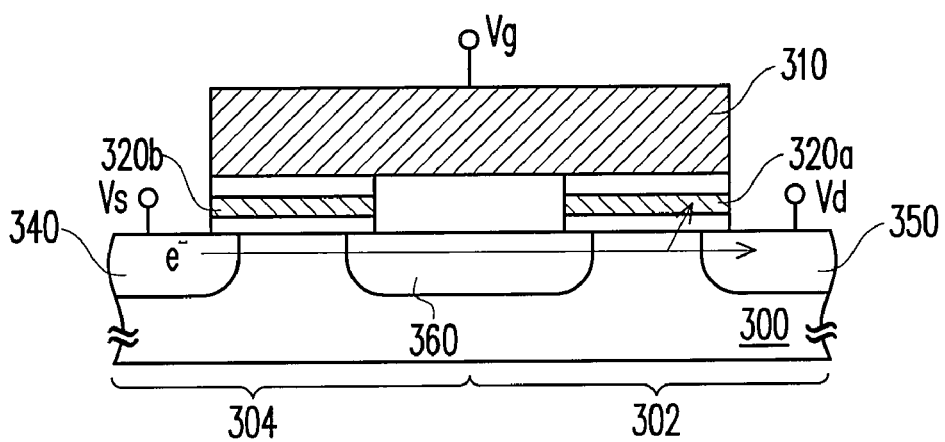

When Vm is equal to $Vm_0$ at which Is is equal to Id (Im=0), the residual energy E1 of electrons at the region 360 satisfies "E1≦e.(Vm−Vs)", and that (E2) of electrons to the region 350 satisfies "E2≦e.(Vd−Vm)". In this case, the punch-through suppression is the same as that in the case of FIG. 3, and the warm-up effect is also insignificant so that the program speed is not raised.

When Vm is higher than $Vm_0$ and within a suitable range below Vd, low-energy electrons have a larger chance to flow out of the middle region 360 to the Vm source, while high-energy electrons tend to travel through the S/D region 360 and retain some residual energy before being accelerated again in the channel of the cell 302. The residual energy E2 of the electrons at the S/D region 350 satisfies "E2>e.(Vd−Vm)". The acceleration effect in the channel of the cell 302 is sufficiently strong since (Vd−Vm) is not too small, so that the programming efficiency is improved.

When Vm is higher than $Vm_0$ and is out of the suitable range but below Vd, the residual energy E1 of electrons at the region 360 satisfies "E1≦e.(Vm−Vs)", and most electrons flow out of the middle region 360 to the Vm source and are not involved in the injection event in the selected cell 302. The residual energy E2 of the electrons at the S/D region 350 satisfies "E2≧e.(Vd−Vm)", but the acceleration in the channel of the cell 302 is weak since (Vd−Vm) is small. Consequently, the program efficiency is reduced. Besides, the large value of (Vm−Vs) may disturb the neighboring cell 304.

Figure 7:
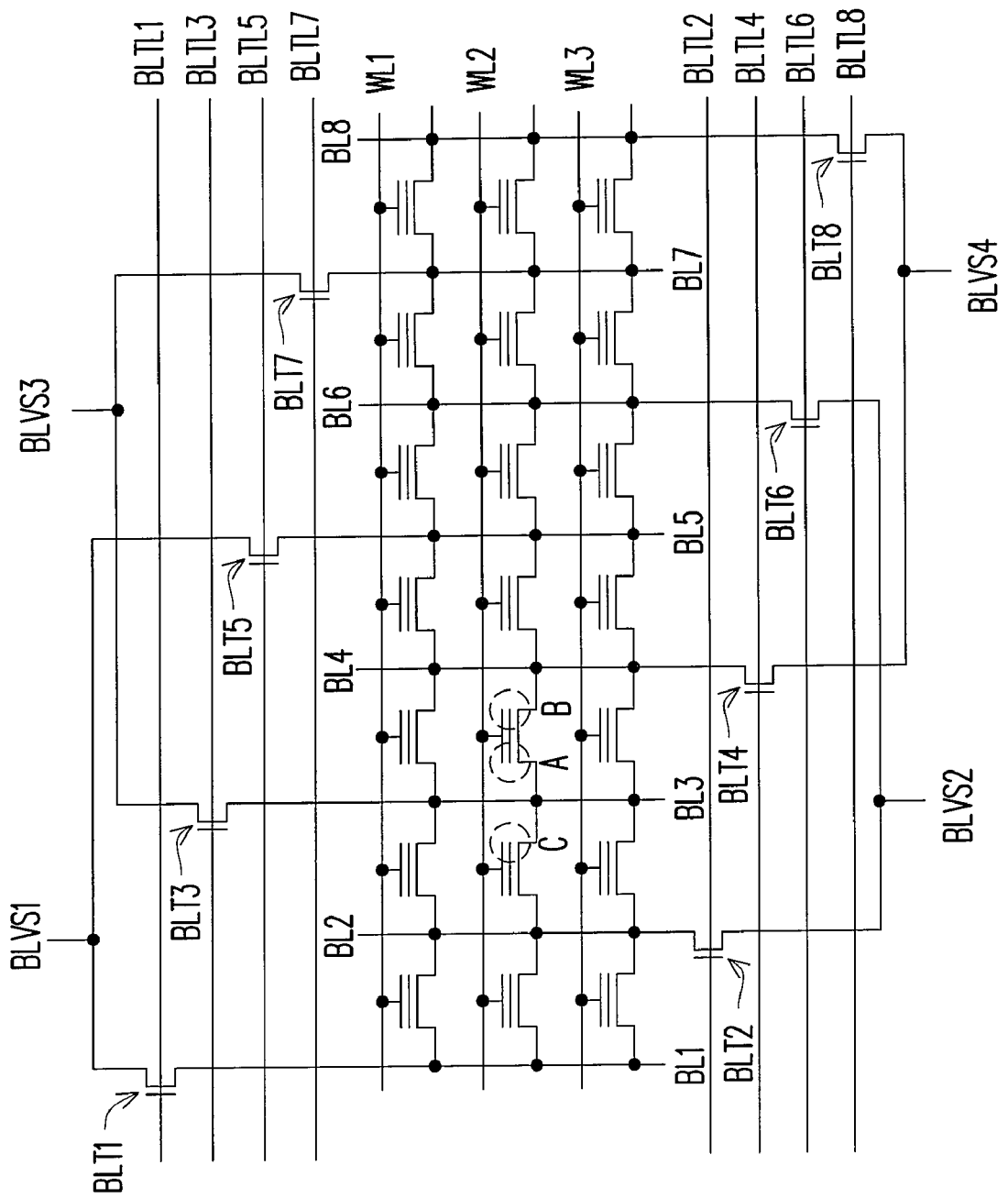
FIG. 7 illustrates a circuit diagram of an exemplary non-volatile memory array that can be programmed with the programming method of this invention according to the first embodiment of this invention.

FIG. 7 illustrates a circuit diagram of a non-volatile memory array that can be programmed with the programming method of this invention according to the first embodiment of this invention.

Referring to FIG. 7, the memory array includes rows and columns of MOS-type cells, a plurality of word lines WL and a plurality of bit lines BL. Each cell includes a control gate, a charge storage layer under the control gate, and two S/D regions beside the control gate. Two neighboring cells in the same row shares an S/D region. Each word line WL is coupled to the control gates of one row of cells. Each bit line BL is coupled to one column of S/D regions and also to a voltage source BLVS via a select transistor BLT, of which the gate is coupled to a line BLTL and the two S/D regions are coupled to the BL and the BLVS respectively. Two bit lines separated by three other bit lines are coupled to the same voltage source via two select transistors respectively.

To program a cell, the word line coupled to its gate is applied with a gate voltage to turn on the channel of the cell, Vd, Vm and Vs are applied from the three voltage sources coupled to the three bit lines coupled to the two S/D regions of the cell and the S/D region of a neighboring cell not shared with the cell, and the corresponding three bit line select transistors BLT are turned on with a suitable voltage on the corresponding lines BLTL to pass Vd, Vm and Vs to the three bit lines respectively.

When the charge storage layer of each cell is a charge trapping layer, two bits can be stored in one memory cell successively. Exemplary bias configurations for the programming of the two bits A and B of a selected cell and one bit C of another selected cell are given in Table 1. The method of successively writing two bits of one cell having a charge trapping layer is exemplified by the programming of the bits A and B with the bias configurations shown in Table 1.

TABLE 1

|  | Bit A | Bit B | Bit C |
|---|---|---|---|
| BLVS1 | 0 V (=Vs) | floated | 0 V (=Vs) |
| BLVS2 | floated | 0 V (=Vs) | 2 V (=Vm) |
| BLVS3 | 5 V (=Vd) | 2 V (=Vm) | 5 V (=Vd) |
| BLVS4 | 2 V (=Vm) | 5 V (=Vd) | floated |
| WL2 | 10 V | 10 V | 10 V |
| BLTL1 | 0 V | 0 V | 10 V |
| BLTL2 | 0 V | 10 V | 10 V |
| BLTL3 | 10 V | 10 V | 10 V |
| BLTL4 | 10 V | 10 V | 0 V |
| BLTL5 | 10 V | 0 V | 0 V |
| BLTL6 | 0 V | 0 V | 0 V |
| BLTL7 | 0 V | 0 V | 0 V |
| BLTL8 | 0 V | 0 V | 0 V |
| P-well | 0 V or −1 V | 0 V or −1 V | 0 V or −1 V |
| Unselected WL1, WL3 | 0 V or −2 V | 0 V or −2 V | 0 V or −2 V |

Figure 8:
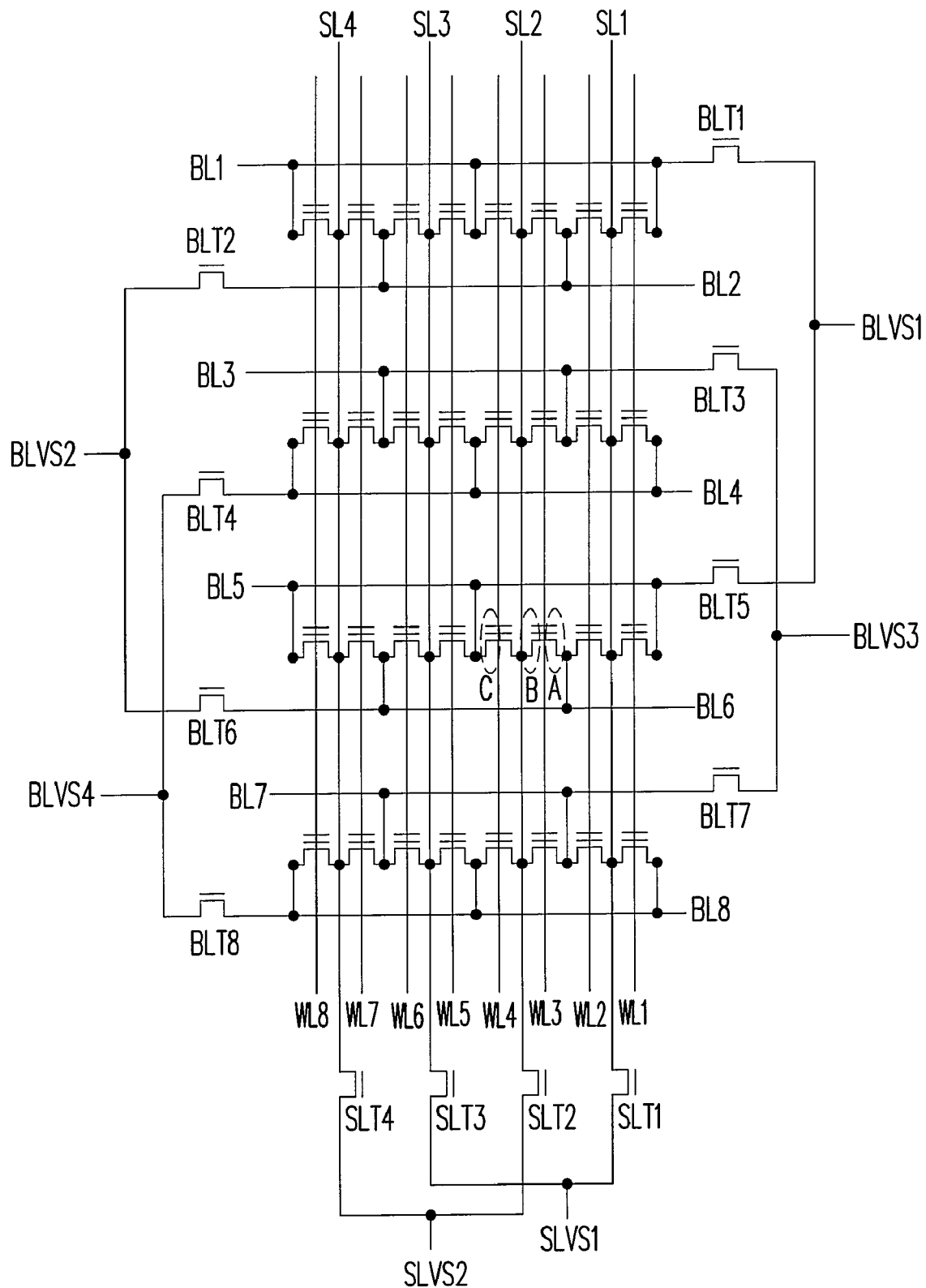
FIG. 8 illustrates a circuit diagram of another exemplary non-volatile memory array that can be programmed with the programming method of this invention according to the second embodiment of this invention.

FIG. 8 illustrates a circuit diagram of another non-volatile memory array that can be programmed with the programming method of this invention according to the second embodiment of this invention.

Referring to FIG. 8, the memory array includes rows and columns of MOS-type cells, word lines WL, source lines SL and bit lines BL. Each cell includes a control gate, a charge storage layer under the control gate and two S/D regions beside the control gate. Two neighboring cells in the same row shares an S/D region. Each word line WL is coupled to the control gates of one column of cells. Each source line SL is coupled to one column of S/D regions. In each row of cells, the S/D regions are alternately coupled to a source line and one of two bit lines BL and the S/D regions not coupled to the source lines are coupled to the two bit lines BL alternately.

Accordingly, the three S/D regions for the programming of a selected cell may be coupled to a bit line, a source line and another bit line respectively, or to a source line, a bit line and another source line respectively. Each source line is coupled to a source line voltage source SLVS via a source line select transistor SLT whose two S/D regions are coupled to the source line SL and the SLVS respectively. Each bit line BL is coupled to a bit line voltage source BLVS via a bi-line select transistor BLT whose two S/D regions are coupled to the bit line BL and the BLVS respectively.

To program a cell, the word line coupled to its control gate is applied with a gate voltage to turn on the channel of the cell, the word line coupled to the control gate of the neighboring cell partaking in the programming is applied with the same or higher gate voltage to turn on the neighboring cell, Vd, Vs and Vm are applied from three voltage sources coupled to the two bit lines and the source line, or the two source lines and the bit line, respectively coupled to a S/D region of the cell, a S/D region of the neighboring cell and the S/D region shared by the two cells, and the corresponding three bit/source line select transistors BLT/SLT are turned on by applying a suitable voltage to their gates to pass the voltages Vd, Vs and Vm to the three bit/source lines.

When the charge storage layer of each cell is a charge trapping layer, two bits can be stored in one memory cell successively. Exemplary bias configurations for the programming of the two bits A and B of a selected cell and one bit C of another selected cell are given in Table 2. The method of successively writing two bits of one cell having a charge trapping layer is exemplified by the programming of the bits A and B with the bias configurations shown in Table 2.

TABLE 2

|  | Bit A | Bit B | Bit C |
|---|---|---|---|
| BLVS1 | 0 V (=Vs) | floated | 5 V (=Vd) |
| BLVS2 | 5 V (=Vd) | 2 V (=Vm) | 0 V (=Vs) |
| BLVS3 | floated | floated | Floated |
| BLVS4 | floated | floated | Floated |
| WL2 | 0 V or −2 V | 12 V | 0 V or −2 V |
| WL3 | 10 V | 10 V | 12 V |
| WL4 | 12 V | 0 V or −2 V | 10 V |
| BLT1 (gate) | 0 V | 0 V | 0 V |
| BLT2 (gate) | 0 V | 0 V | 0 V |
| BLT3 (gate) | 0 V | 0 V | 0 V |
| BLT4 (gate) | 0 V | 0 V | 0 V |
| BLT5 (gate) | 10 V | 0 V | 10 V |
| BLT6 (gate) | 10 V | 10 V | 10 V |
| BLT7 (gate) | 0 V | 0 V | 0 V |
| BLT8 (gate) | 0 V | 0 V | 0 V |
| SLVS1 | floated | 0 V (=Vs) | Floated |
| SLVS2 | 2 V (=Vm) | 5 V (=Vd) | 2 V (=Vm) |
| SLT1 (gate) | 0 V | 10 V | 0 V |
| SLT2 (gate) | 10 V | 10 V | 10 V |
| SLT3 (gate) | 0 V | 0 V | 0 V |
| SLT4 (gate) | 0 V | 0 V | 0 V |
| P-well | 0 V or −1 V | 0 V or −1 V | 0 V or −1 V |
| Unselected WL1, WL5-8 | 0 V or −2 V | 0 V or −2 V | 0 V or −2 V |

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of programming a first cell in a memory, wherein the first cell has a first S/D region and shares a second S/D region with a second cell that has a third S/D region opposite to the second S/D region, comprising:
   turning on channels of the first cell and the second cell; and
   applying a first voltage to the first S/D region, a second voltage to the second S/D region and a third voltage to the third S/D region, wherein a value of the second voltage is between a value of the first voltage and a value of the third voltage, and the values of the first to third voltages make carriers flow from the third S/D region to the first S/D region and cause hot carriers in the channel of the first cell to be injected into a charge storage layer of the first cell.

2. The method of claim 1, wherein a control gate of the first cell is contiguous with a control gate of the second cell.

3. The method of claim 1, wherein a control gate of the first cell is separated from a control gate of the second cell.

4. The method of claim 1, wherein the first cell and the second cell are of N-type and the value of the first voltage is positively higher than the value of the third voltage.

5. The method of claim 4, wherein the value of the second voltage is higher than a voltage value at which an electron current from the third S/D region to the second S/D region is equal to an electron current from the second S/D region to the first S/D region.

6. The method of claim 4, wherein turning on the channels of the first cell and the second cell comprises applying 0V or a negative voltage to a substrate of the memory.

7. The method of claim 1, wherein the charge storage layer is a floating gate or a charge trapping layer.

8. The method of claim 7, wherein the charge trapping layer comprises silicon nitride.

9. A method of programming a cell in a memory array, comprising:

turning on a channel of a first cell to be programmed and a channel of a second cell neighboring to the first cell, wherein the first cell has a first S/D region and shares a second S/D region with the second cell and the second cell has a third S/D region;

applying, via a first select transistor, a first voltage to a first line coupled to the first S/D region;

applying, via a second select transistor, a second voltage to a second line coupled to the second S/D region; and applying, via a third select transistor, a third voltage to a third line coupled to the third S/D region, wherein a value of the second voltage is between a value of the first voltage and a value of the third voltage, and the values of the first to third voltages make carriers flow from the third S/D region to the first S/D region and cause hot carriers in the channel of the first cell to be injected into a charge storage layer of the first cell.

10. The method of claim 9, wherein each cell is of N-type and the value of the first voltage is positively higher than the value of the third voltage.

11. The method of claim 10, wherein the value of the second voltage is higher than a voltage value at which an electron current from the third S/D region to the second S/D region is equal to an electron current from the second S/D region to the first S/D region.

12. The method of claim 10, wherein turning on the channels of the first cell and the second cell comprises applying 0V or a negative voltage to a substrate of the memory array.

13. The method of claim 9, wherein the charge storage layer is a floating gate or a charge trapping layer.

14. The method of claim 13, wherein the charge trapping layer comprises silicon nitride.

15. The method of claim 13, which writes a first bit of the first cell near the first S/D region while the charge storage layer is a charge trapping layer.

16. The method of claim 15, wherein the first cell shares the first S/D region with a third cell that has a fourth S/D region, further comprising a process of writing a second bit of the first cell near the second S/D region that comprises:

turning on the channel of the first cell and a channel of the third cell;

applying the first voltage to the second line via the second select transistor;

applying the second voltage to the first line via the first select transistor; and applying, via a fourth select transistor, the third voltage to a fourth line coupled to the fourth S/D region.

17. The method of claim 9, wherein control gates of the first and the second cells are coupled to one word line.

18. The method of claim 17, wherein the control gates of the first and the second cells are portions of the one word line.

19. The method of claim 17, wherein the memory array comprises:

rows and columns of cells each including a control gate, wherein two neighboring cells in the same row shares an S/D region;

a plurality of word lines, each coupled to the control gates of one row of cells; and a plurality of bit lines, each coupled to one column of S/D regions.

20. The method of claim 9, wherein control gates of the first and the second cell are coupled to two word lines respectively.

21. The method of claim 20, wherein the control gate of each of the first and the second cells is a portion of the corresponding word line.

22. The method of claim 20, wherein the memory array comprises:

rows and columns of cells each including a control gate, wherein two neighboring cells in the same row shares an S/D region;

a plurality of word lines, each coupled to the control gates of one column of cells; and a plurality of source lines and a plurality of bit lines, wherein each source line is coupled to one column of S/D regions, and in each row of cells, the S/D regions are alternately coupled to a source line and one of two bit lines and the S/D regions not coupled to the source lines are coupled to the two bit lines alternately, and wherein the first S/D region, the second S/D region and the third S/D region are coupled to a bit line, a source line and another bit line respectively, or to a source line, a bit line and another source line respectively.

23. A memory apparatus comprising:

a memory array including a plurality of cells arranged in rows and columns, wherein each cell has a first S/D region and shares a second S/D region with a neighboring cell; and a circuit unit applying at least the following steps in programming:

turning on a channel of a first cell to be programmed and a channel of a second cell neighboring to the first cell, wherein the first cell has the first S/D region and shares the second S/D region with the second cell and the second cell has a third S/D region;

applying, via a first select transistor, a first voltage to a first line coupled to the first S/D region;

applying, via a second select transistor, a second voltage to a second line coupled to the second S/D region; and applying, via a third select transistor, a third voltage to a third line coupled to the third S/D region, wherein a value of the second voltage is between a value of the first voltage and a value of the third voltage, and the values of the first to third voltages make carriers flow from the third S/D region to the first S/D region and cause hot carriers in the channel of the first cell to be injected into a charge storage layer of the first cell.

24. The memory apparatus of claim 23, wherein each cell is of N-type and the value of the first voltage is positively higher than the value of the third voltage.

25. The memory apparatus of claim 24, wherein the value of the second voltage is higher than a voltage value at which an electron current from the third S/D region to the second S/D region is equal to an electron current from the second S/D region to the first S/D region.

26. The memory apparatus of claim 24, wherein the circuit unit applies 0V or a negative voltage to a substrate of the memory array in turning on the channels of the first cell and the second cell.

27. The memory apparatus of claim 23, wherein the charge storage layer is a floating gate or a charge trapping layer.

28. The memory apparatus of claim 27, wherein the charge storage layer is a charge trapping layer, the first cell also shares the first S/D region with a third cell that has a fourth S/D region, and the circuit unit further applies the following steps in the programming:

turning on the channel of the first cell and a channel of the third cell;

applying the first voltage to the second line via the second select transistor;

applying the second voltage to the first line via the first select transistor; and applying, via a fourth select transistor, the third voltage to a fourth line coupled to the fourth S/D region.

29. The memory apparatus of claim 23, wherein control gates of the first and the second cells are coupled to one word line.

30. The memory apparatus of claim 29, wherein the control gates of the first and the second cells are portions of the one word line.

31. The memory apparatus of claim 29, wherein the memory array comprises:
   rows and columns of cells each including a control gate, wherein two neighboring cells in the same row shares an S/D region;
   a plurality of word lines, each coupled to the control gates of one row of cells; and
   a plurality of bit lines, each coupled to one column of S/D regions.

32. The memory apparatus of claim 23, wherein control gates of the first and the second cell are coupled to two word lines respectively.

33. The memory apparatus of claim 32, wherein the control gate of each of the first and the second cells is a portion of the corresponding word line.

34. The memory apparatus of claim 32, wherein the memory array comprises:
   rows and columns of cells each including a control gate, wherein two neighboring cells in the same row shares an S/D region;
   a plurality of word lines, each coupled to the control gates of one column of cells; and
   a plurality of source lines and a plurality of bit lines, wherein each source line is coupled to one column of S/D regions, and in each row of cells, the S/D regions are alternately coupled to a source line and one of two bit lines and the S/D regions not coupled to the source lines are coupled to the two bit lines alternately, and
   wherein the first S/D region, the second S/D region and the third S/D region are coupled to a bit line, a source line and another bit line respectively, or to a source line, a bit line and another source line respectively.

* * * * *